United States Patent
Richart et al.

[11] Patent Number: 6,140,216
[45] Date of Patent: Oct. 31, 2000

[54] POST ETCH SILICIDE FORMATION USING DIELECTRIC ETCHBACK AFTER GLOBAL PLANARIZATION

[75] Inventors: Robert B. Richart; Shyam Garg, both of Austin, Tex.

[73] Assignee: Advanced Micro Devices, Inc., Sunnyvale, Calif.

[21] Appl. No.: 09/060,522

[22] Filed: Apr. 14, 1998

[51] Int. Cl.[7] ..................... H01L 21/336; H01L 21/3205
[52] U.S. Cl. ................. 438/592; 438/305; 438/588; 438/593; 438/594
[58] Field of Search .................. 438/305, 588, 438/593, 594, 592

[56] References Cited

U.S. PATENT DOCUMENTS

| | | | |
|---|---|---|---|
| 5,086,017 | 2/1992 | Lu | 437/200 |
| 5,372,673 | 12/1994 | Stager et al. | 156/626 |
| 5,470,772 | 11/1995 | Woo | 437/43 |
| 5,731,239 | 3/1998 | Wong et al. | 438/296 |
| 5,885,879 | 3/1999 | Gardner et al. | 438/305 |

FOREIGN PATENT DOCUMENTS

| | | |
|---|---|---|
| 63031136 | 9/1988 | European Pat. Off. . |
| 0 437 306 | 7/1991 | European Pat. Off. . |
| 2-126684 | 5/1990 | Japan . |

OTHER PUBLICATIONS

Patent Abstracts of Japan, pub. No. 63031136, pub. date Feb. 9, 1988, app. No. 61174845, app. date Jul. 25, 1986 (Fujitsu Ltd.).

Patent Abstracts of Japan, pub. No. 09055442, pub. date Feb. 25, 1997, app. No. 07209601, app. date Aug. 17, 1995 (Toshiba Corp.).

Patent Abstracts of Japan, pub. No. 02126684, pub. date May 15, 1990, app. No. 63280632, app. date Nov. 7, 1988 (Toshiba Corp.).

Patent Abstracts of Japan, pub. No. 02283034, pub. date Nov. 20, 1990, app. No. 01103465, app. date Apr. 25, 1989 (Matsushita Electron Corp.).

International Search Report mailed Feb. 11, 1999 for International application No. PCT/US98/22004.

*Primary Examiner*—John F. Niebling
*Assistant Examiner*—Alexander G. Ghyka
*Attorney, Agent, or Firm*—Kevin L. Daffer; Conley, Rose & Tayon

[57] ABSTRACT

The present invention describes the formation of a silicide layer upon a gate conductor by using a masking layer which covers the source/drain regions of the transistor. The method includes forming a masking layer over a semiconductor substrate such that the gate conductor is substantially covered by the masking layer. The masking layer is preferably planarized using any of a variety of well known techniques. After planarization of the masking layer, the masking layer is etched such that an upper surface of the gate conductor is exposed. A silicide layer is preferably formed upon the upper surface of the gate conductor. The masking layer prevents the concurrent formation of silicide upon the source/drain regions.

23 Claims, 3 Drawing Sheets

POST ETCH SILICIDE FORMATION USING DIELECTRIC ETCHBACK AFTER GLOBAL PLANARIZATION

BACKGROUND OF THE INVENTION

1. Field of the Invention

This invention relates to semiconductor processing and, more particularly, to a method for forming a MOS transistor with a silicide layer formed on the gate conductor without concurrent formation of silicide on the source and drain regions.

2. Description of the Related Art

The fabrication of a metal-oxide semiconductor ("MOS") transistor is well known in the art of semiconductor processing. As the transistor dimensions of integrated circuits decrease, the sheet resistivity of the shallow junctions of the lightly doped drain ("LDD") regions increases. To reduce these resistance values, a silicide is typically formed over these regions. Additionally, it is also important to reduce the interconnect resistance of the polysilicon gate to the interconnect lines. Reduction of the interconnect resistance typically decreases the RC time delays, thus increasing the performance of the integrated circuit. A procedure which simultaneously reduces the resistance values of the source/drain regions, as well as the interconnect resistance of the gate conductor, is known as a self-aligned silicide ("salicide") procedure. A salicide procedure involves depositing a metal over a MOS transistor and reacting the metal with any exposed silicon-based areas to form silicide portions. Following silicide formation, a selective etch removes the unreacted metal without attacking the silicide.

FIG. 1 depicts a typical MOS conductor after salicidation of the exposed silicon surfaces. Typically, a refractory metal is deposited over the semiconductor topography. A variety of refractory metals may be used, including, but not limited to, tungsten, titanium, tantalum, cobalt, and molybdenum. After deposition of the refractory metal the MOS transistor is subjected to an anneal process. The anneal process preferably causes the growth of silicide layers 60 and 62 over the source/drain 44 and gate conductor regions 30, respectively. Note that the spacers 50 are used to prevent silicide from forming along the walls of the gate conductor. This typically prevents the gate and the source/drain regions from becoming electrically connected. After the silicide formation is complete, all non-reacted metal is removed.

The salicide process has the limitation that the gate and the source/drain silicides are formed at the same time. For most devices, it is desirable that a silicide layer is formed on the gate, thus allowing the gate to have the lowest possible interconnect resistance. However, in some devices, it is undesirable that a silicide is formed on the source/drain regions. For example, many flash EPROM devices incorporate resistors within the source and/or drain regions. In order to operate per design, the resistance value of these devices may need to be quite high. If a silicide is formed in a highly resistive source or drain area, the EPROM device may be rendered inoperable. Another problem associated with silicide formation on the source and/or drain areas may relate to diffusion problems. For example, it is known that some refractory metals readily diffuse into the source and/or drain regions during salicide formation. This diffusion tends to lead to spiking through the junction, causing substantial leakage problems.

One method to overcome the above problem involves the selective etching of a deposited silicide layer. Typically, a refractory metal silicide is deposited over the source/drain regions, as well as the polysilicon layer, prior to the formation of the gate conductor. A masking step must therefore be used, whereby the regions where the silicide is desired are masked using standard photolithographic techniques. The unmasked portions of the silicide are typically etched, leaving silicide in the desired locations. Typically, tungsten silicide ($WSi_2$) is used for such a procedure, even though it has a higher resistance than other metal silicides (e.g., titanium silicide, $TiSi_2$). Titanium silicide is typically not used because, although it is desirable for its low resistance, it is much more difficult to etch than $WSi_2$. In addition, this process may suffer from alignment problems as the size of the transistors drops to sub-micron levels.

It is therefore desirable to devise a process by which a self-aligned silicidation of the gate structures may be accomplished without the concurrent silicidation of the source/drain regions. It is further desirable that such a process involves a minimal number of additional steps. It is still further desired that the process be applicable to low resistance refractory metal silicides (e.g., $TiSi_2$) defined exclusively to the gate conductor.

SUMMARY OF THE INVENTION

The problems identified above are in large part addressed by the method hereof for forming silicided gate conductors upon a semiconductor substrate. That is, the present invention contemplates the formation of a silicide layer upon a gate conductor by using a masking layer which covers the source/drain regions of the transistor. The masking layer is preferably formed without the use of photolithographic techniques, thus avoiding alignment problems.

A transistor may be formed on a semiconductor substrate, as is well known in the art. The transistor includes a gate conductor which is preferably situated adjacent to source/drain regions. The source/drain regions may include an LDD structure. The gate conductor preferably includes a layer of polysilicon which will later be rendered conductive by a subsequent implanting step. Spacers are preferably formed adjacent to the gate conductor. The spacers are preferably used to form the LDD regions.

A masking layer is preferably formed over the semiconductor substrate covering the gate conductor. After formation of the masking layer, the masking layer is preferably planarized such that the upper surface of the masking layer is substantially flat and co-planar with the gate conductor upper surface. A number of methods and materials are available for performing the formation of a substantially planar masking layer. These methods may include, but are not limited to, formation of a masking layer via a spin-on process, planarization of a masking layer via sacrificial-layer etchback, or chemical-mechanical polishing.

After planarization of the masking layer, the masking layer is preferably etched such that the upper surface of the gate conductor is exposed. Preferably, the masking layer is removed to a point below the upper surface of the gate conductor. The process conditions may be chosen such that the masking layer is removed with high selectivity against removal of the underlying gate conductor material.

A refractory metal is preferably deposited over the semiconductor topography. A variety of refractory metals may be used, including, but not limited to, tungsten, titanium, tantalum, cobalt, and molybdenum. After deposition of the metal, the metal is preferably subjected to an anneal process. The anneal process preferably causes the growth of silicide within the upper surface of gate conductor. The masking layer and spacers preferably prevent formation of silicide in the LDD regions. After the anneal process, all non-reacted metal is preferably removed, leaving the formed silicide over the gate conductor.

After the silicide layer is formed, the remainder of the masking layer may be removed by a dry etch process. Alternatively, a dielectric insulating layer may formed over the masking layer and gate conductor. The insulating layer preferably protects the gate conductor and silicide from subsequent processing steps.

BRIEF DESCRIPTION OF THE DRAWINGS

Other objects and advantages of the invention will become apparent upon reading the following detailed description and upon reference to the accompanying drawings in which.

Figure 1:
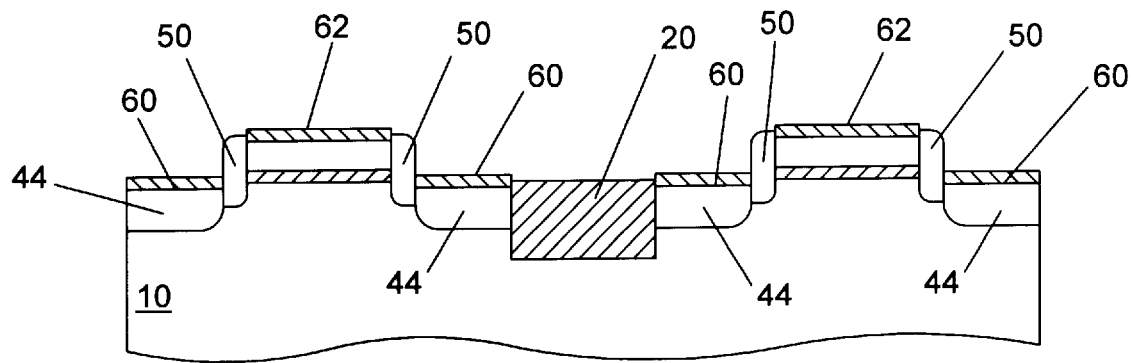
FIG. 1 is a partial cross-sectional view of the semiconductor topography subsequent to a salicide processing step performed on the device of FIG. 1, wherein silicide layers are formed upon the gate conductors and the source/drain regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 2:
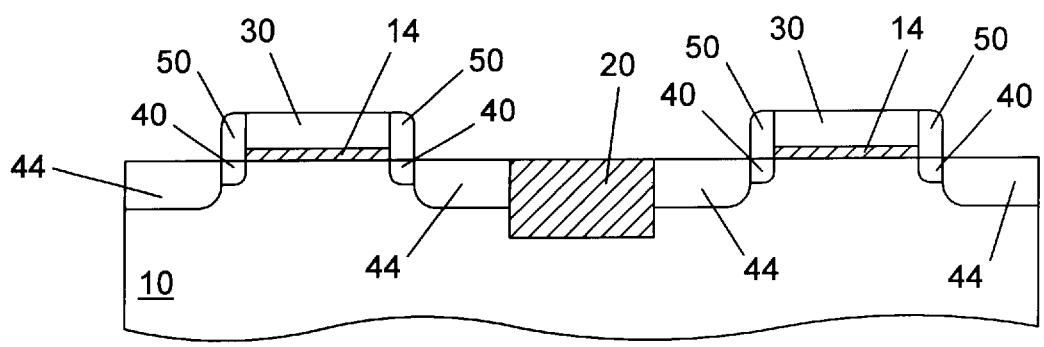
FIG. 2 is a partial cross-sectional view of a semiconductor topography, wherein two gate conductors are formed, separated by an isolation structure.

Turning now to the drawings, FIG. 2 is a partial cross-sectional view of a semiconductor substrate 10 with two transistors formed upon the semiconductor substrate surface. Semiconductor substrate 10 preferably comprises lightly doped n-type or p-type single-crystalline silicon. Isolation structure 20 is preferably formed in the field region of semiconductor substrate 10. Isolation structure 20 is shown here as a shallow trench filled with a dielectric material, but it may alternatively comprise a LOCOS type isolation structure.

Deposited upon the semiconductor substrate 10 is a dielectric layer 14. Dielectric layer 14 is preferably made of silicon dioxide. The dielectric layer 14 is preferably either deposited or grown from a heated, oxygen bearing source. Deposited upon the dielectric layer 14 is a gate material layer 30. The gate material is preferably made of polysilicon which will later be rendered conductive by a subsequent implanting step. The gate material layer 30 is preferably deposited using a low pressure chemical vapor deposition ("CVD") process. The dielectric layer and the gate material layer together form a gate conductor structure.

The source/drain regions are now preferably formed adjacent to the gate conductor. The source/drain region may be formed by ion implantation into the junction regions, with the gate conductor serving as a mask to prevent implantation of the source/drain ions into the channel region.

Preferably, an LDD structure is formed. The LDD implant is preferably forwarded into substrate 10 after formation of gate conductor 30. Gate conductor 30 may serve to mask the LDD implant from channel region 32. The LDD implant may be n-type or p-type depending on the type of transistor to be formed. The gate conductor 30 preferably serves to align the LDD implant area 40 adjacent to the gate conductor.

A spacer layer is preferably deposited across the entire semiconductor topography to form a conformal layer. After deposition, the material preferably undergoes an anisotropic etch. An anisotropic etch, such as a plasma etch, employs both physical and chemical removal mechanisms. Ions are typically bombarded at an angle substantially perpendicular to the semiconductor substrate upper surface. This causes substantially horizontal surfaces to be removed faster than substantially vertical surfaces. During this etching procedure the spacer layer is preferably removed such that the only regions of the spacer layer which remain may be those regions near substantially vertical surfaces. The remaining regions of the spacer layer are henceforth referred to as spacers 50.

After spacer formation, the source drain regions are formed. Gate conductor 30 and spacers 50 preferably serve to mask the source/drain implant from channel region 32 and a portion of the LDD areas under the spacers 40. The source/drain implant is preferably of the same dopant species as the LDD implant, albeit at a higher concentration and energy than the LDD implants. Resulting from the source drain implant, source/drain regions 44 are produced. The spacers 50 preferably serve to align the source/drain regions 44 a spaced distance from the gate conductor 30.

After formation of the transistor is completed, it is preferred that a silicide layer is produced within the upper surface of gate conductor 30 without forming a silicide layer within the source/drain regions. The formation of a silicide layer over the gate conductor, but not the source drain regions, is typically used for devices requiring high resistance resistors. For example, many flash EPROM devices make use of high resistance $n^+$ and $p^+$ diffused resistors. While the formation of a silicide layer on the gate of such structures may increase the performance of these devices, the formation of silicide on the source drain regions may render the device inoperable.

Figure 3:
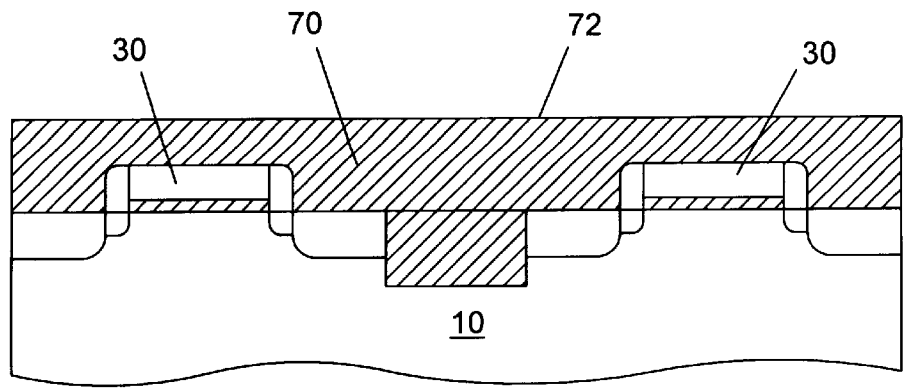
FIG. 3 is a partial cross-sectional view of the semiconductor topography according to a processing step subsequent to FIG. 2, wherein a planarized dielectric layer is deposited across the semiconductor substrate.

Referring to FIG. 3, a masking layer 70 is preferably formed over the semiconductor substrate 10. Masking layer 70 preferably covers gate conductor 30. After formation of the masking layer, the masking layer is preferably planarized such that the upper surface of the masking layer 72 is substantially planar. A number of methods and materials are available for performing the formation of a substantially planar masking layer. These methods may include, but are not limited to, formation of a masking layer via a spin-on process, planarization of a masking layer via sacrificial-layer etchback, and chemical-mechanical polishing.

In one embodiment, the planarized masking layer is preferably produced by applying a liquid form of the masking layer onto the semiconductor substrate and subsequently curing the masking layer to a solid. The liquid form of the masking layer is preferably applied via a spin coating procedure. In a spin coating procedure, the liquid form of the masking layer is preferably dispensed onto the silicon substrate. The silicon substrate may be rapidly spun until the liquid is uniformly spread across the wafer. After a uniform layer of the masking liquid is formed, the masking layer is preferably cured to form a solid masking layer having a substantially planar surface. This method can be used with a variety of materials including, but not limited to, polyimide, photoresist, and spin-on glasses. When a photoresist material is used, the liquid photoresist is typically cured to a solid masking layer by spinning the wafer at a constant speed until the solvent has evaporated from the photoresist material. Polyimide and spin-on glasses typically require a baking process in which the wafer is heated to cure the masking layer. In some cases the baking process is used to flow the polymide or spin-on glass to improve the planarity.

In an other embodiment, a sacrificial etchback method may be used. This process is preferably carried out by first depositing a CVD film that will serve as a masking layer. Preferably the masking layer is silicon oxide or silicon oxynitride. This masking layer is preferably covered with a planarization layer which will subsequently be etched off. Preferably, the planarization layer is formed from a liquid-based masking layer in the manner previously described. After the planarization layer has been cured, the upper surface of the planarization layer is preferably substantially planar. The planarization layer is preferably etched back in by a plasma until the topmost regions of the masking layer are exposed. The etch chemistry may then be modified such that the planarization layer and the masking layer are etched at approximately the same rate. The etch is preferably continued until all of the planarization layer is etched away. At this point, the surface of the masking layer is preferably substantially planar, since the profile of the planarization layer is transferred to the masking layer.

In another embodiment, a chemical-mechanical polishing of the masking layer may be used to create a planar surface. The chemical-mechanical process involves holding and rotating the semiconductor substrate against a wetted polishing surface under controlled chemical, pressure, and temperature conditions. A chemical slurry containing a polishing agent, such as alumina or silica, is preferably used as the polishing material. Additionally, the chemical slurry may contain selected chemicals which etch the masking layer during processing. The combination of mechanical and chemical removal of material during polishing preferably results in the removal of the elevated portions of the masking layer faster than the lower portions. In this manner, a substantially planarized surface may be obtained.

Figure 4:
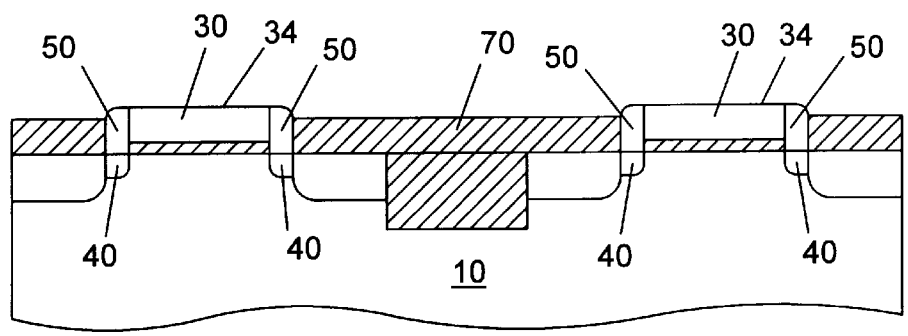
FIG. 4 is a partial cross-sectional view of the semiconductor topography according to a processing step subsequent to FIG. 3, wherein the planarized dielectric layer is etched back.

After planarization of the masking layer 70, the masking layer is preferably etched such that the upper surface 34 of gate conductor 30 is exposed, as depicted in FIG. 4. Preferably, the masking layer is removed to a point below the upper surface 34 of the gate conductor. Removal of the masking layer is preferably achieved by a dry etch process, e.g., a plasma etch. The process conditions may be chosen such that the masking layer is removed with high selectivity against removal of the underlying gate conductor material.

Figure 5:
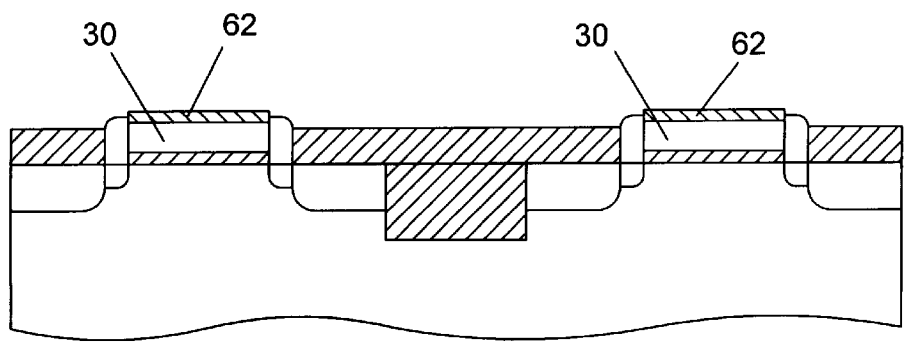
FIG. 5 is a partial cross-sectional view of the semiconductor topography according to a processing step subsequent to FIG. 4, wherein a silicide layer is formed on the upper surface of the gate conductor.

FIG. 5 depicts silicidation of the exposed gate conductor surface. A refractory metal is preferably deposited over the semiconductor topography. A variety of refractory metals may be used, including, but not limited to tungsten, titanium, tantalum, cobalt, and molybdenum. Preferably, titanium is used to form silicide layer 62. The refractory metal is preferably deposited using a CVD process. After deposition of the metal, the metal is preferably subjected to an anneal process. The anneal process is preferably conducted at a temperature above about 600° C. The anneal process preferably causes the growth of silicide 62 within the upper surface of gate conductor 30. The masking layer 70 and spacer 50 preferably prevent formation of silicide in the LDD regions 40. After the anneal process, all non-reacted metal is preferably removed leaving the formed silicide 62 over gate conductor 30. The silicide is then fully annealed at a temperature above about 800° C. The silicide serves to enhance conductivity of subsequent metalization layers drawn to the gate conductor.

Figure 6:
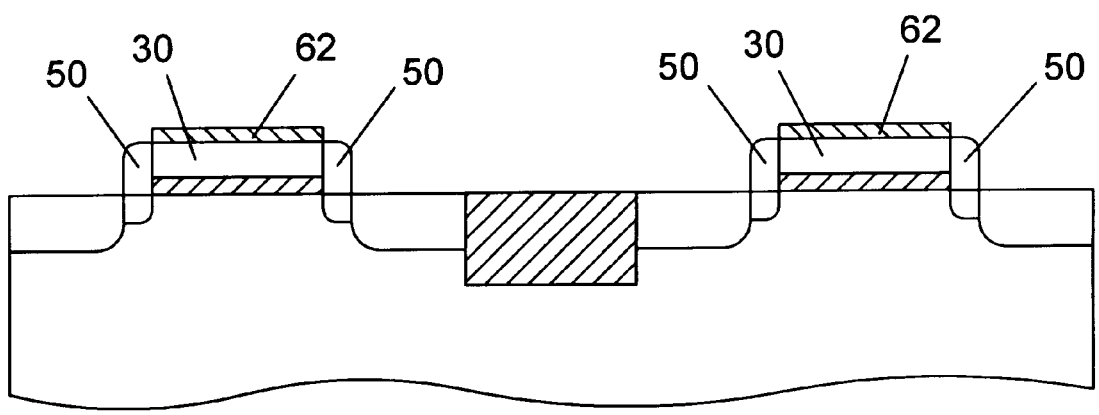
FIG. 6 is a partial cross-sectional view of the semiconductor topography according to a processing step subsequent to FIG. 5, wherein the remaining portion of the planarized dielectric layer is removed.
Figure 7:
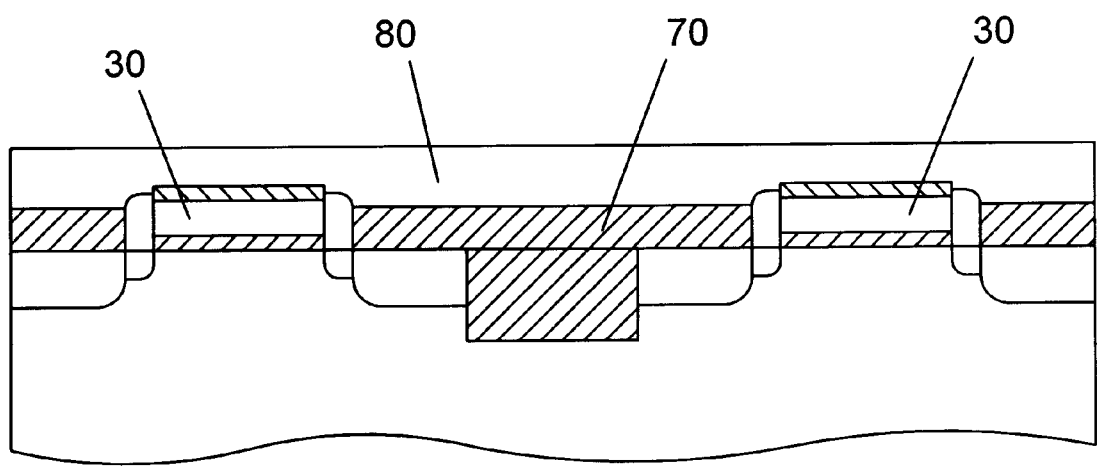
FIG. 7 is a partial cross-sectional view of the semiconductor topography according to a processing step subsequent to FIG. 6, wherein an insulating layer is formed over the remaining planarization layer.

After the silicide layer is formed, the remainder of the masking layer may be removed by a dry etch process, e.g., a plasma etch, as depicted in FIG. 6. The process conditions may be chosen such that the masking layer is removed with high selectivity against removal of the spacers 50 and the silicide 62. Alternatively, a dielectric insulating layer 80 may be formed over the masking layer 70 and gate conductor 30, as depicted in FIG. 7. The insulating layer preferably protects gate conductor 30 and silicide 62 from subsequent processing steps. Contact vias or plugs may thereafter be formed in the insulating layer 80 and masking layer 70 down to the source and/or drain areas. The contact vias, in combination with overlying gate conductors, interconnect the transistors within an integrated circuit.

An advantage of the present method is that it preferably allows the formation of a silicide layer upon the gate conductor, without the concurrent formation of silicide upon the source/drain regions. The process preferably accomplishes this while still forming a self-aligned silicide upon the gate conductor. The method takes advantage of a masking layer which is prepared such that the source/drain regions are protected, while the upper surface of the gate conductor is exposed. The masking layer is preferably formed without the use of a photoresist masking step, thus avoiding any alignment problems which may be encountered when forming sub-micron transistors. By leaving the upper portion of the conductive gate exposed, while protecting the other regions of the transistor, the silicide may be formed using a self-aligned method.

It will be appreciated to those skilled in the art having the benefit of this disclosure, that this invention is believed to be capable of forming a silicided gate conductor of a transistor, without concurrent silicidation of the source/drain regions. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming a transistor, comprising:
   forming a gate conductor upon a semiconductor substrate, the gate conductor comprising a dielectric layer and a gate material layer, the gate material layer positioned above the dielectric layer;

implanting a source/drain region adjacent to the gate conductor;

depositing a masking layer on an upper surface of the semiconductor substrate such that the masking layer substantially covers the gate conductor;

depositing a spin-on liquid planarization layer upon the masking layer, wherein an etch rate of the planarization layer is substantially equal to an etch rate of the masking layer;

curing the planarization layer such that the planarization layer becomes substantially solid;

etching the planarization layer and the masking layer until substantially all of the planarization layer is removed;

etching the masking layer to a point such that an upper surface of the gate conductor is substantially exposed; and forming a silicide layer upon the upper surface of the gate conductor.

2. The method of claim 1, wherein the gate conductor is a control gate above a floating gate in a flash EPROM device.

3. The method of claim 1, wherein the dielectric layer comprises silicon dioxide.

4. The method of claim 1, wherein the gate material comprises polysilicon.

5. The method of claim 1, wherein the masking layer comprises polyimide.

6. The method of claim 1, wherein the masking layer comprises photoresist.

7. The method of claim 1, wherein the masking layer comprises CVD oxide.

8. The method of claim 1, wherein the masking layer comprises BPSG.

9. The method of claim 1, wherein the masking layer comprises spin-on glass.

10. The method of claim 1, wherein planarizing the masking layer comprises spin-on application of a liquid masking layer.

11. The method of claim 10, wherein the masking layer planarity is improved by semi-liquid flow using a bake process.

12. The method of claim 1, wherein the depositing the masking layer comprises chemical vapor depositing a dielectric material, and wherein the dielectric material is chosen from the group consisting of silicon oxide and silicon oxynitride.

13. The method of claim 1, wherein a material for the planarization layer is chosen from the group consisting of polyimide, photoresist, and spin-on glasses.

14. The method of claim 1, wherein planarizing the masking layer comprises chemical-mechanical polishing of the masking layer.

15. The method of claim 1, wherein forming the silicide comprises:

depositing a refractory metal over the semiconductor substrate;

reacting a portion of the refractory metal with the upper surface of the gate conductor to produce a silicide layer; and removing the unreacted refractory metal.

16. The method of claim 15, wherein the silicide is fully annealed following said removing of the unreacted refractory metal.

17. The method of claim 1, wherein the silicide is titanium silicide.

18. The method of claim 15, wherein the refractory metal is chosen from the group consisting of tungsten, titanium, tantalum, molybdenum, and cobalt.

19. The method of claim 1, further comprising removing the masking layer subsequent to forming the silicide layer.

20. The method of claim 1, further comprising depositing an insulating layer over the semiconductor substrate subsequent to forming the silicide layer, wherein the insulating layer substantially covers the gate conductor.

21. A method for forming a transistor, comprising:

forming a gate conductor upon a semiconductor substrate, the gate conductor comprising a dielectric layer and a gate material layer, the gate material layer positioned above the dielectric layer;

implanting a source/drain region adjacent to the gate conductor;

depositing an masking layer upon the semiconductor substrate;

depositing a spin-on liquid planarization layer upon the masking layer, wherein an etch rate of the planarization layer is substantially equal to an etch rate of the masking layer;

curing the planarization layer such that the planarization layer becomes substantially solid;

etching the planarization layer and the masking layer until substantially all of the planarization layer is removed;

etching the masking layer to a point such that an upper surface of the gate conductor is substantially exposed; and forming a silicide layer upon the upper surface of the gate conductor.

22. The method of claim 21, wherein the depositing the masking layer comprises chemical vapor depositing a dielectric material, and wherein the dielectric material is chosen from the group consisting of silicon oxide and silicon oxynitride.

23. The method of claim 21, wherein a material for the planarization layer is chosen from the group consisting of polyimide, photoresist, and spin-on glasses.

* * * * *